(12) United States Patent
Pilch et al.

(10) Patent No.: US 11,550,225 B2
(45) Date of Patent: Jan. 10, 2023

(54) EUV RADIATION SOURCE, INSERT FOR AN EUV RADIATION SOURCE AND INSERT FOR AN INSERT FOR AN EUV RADIATION SOURCE

(71) Applicant: Carl Zeiss SMT GmbH, Oberkochen (DE)

(72) Inventors: Iris Pilch, Aalen (DE); Juan Jose Hasbun Wood, Bruckmühl (DE); Christof Metzmacher, Aalen (DE); Michael Hagg, Essingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/336,480

(22) Filed: Jun. 2, 2021

(65) Prior Publication Data

US 2021/0382395 A1    Dec. 9, 2021

(30) Foreign Application Priority Data

Jun. 3, 2020  (DE) .......................... 102020206876.3

(51) Int. Cl.
*G03F 7/20* (2006.01)
*H05G 2/00* (2006.01)

(52) U.S. Cl.
CPC ...... *G03F 7/70033* (2013.01); *G03F 7/70058* (2013.01); *G03F 7/70975* (2013.01); *H05G 2/001* (2013.01)

(58) Field of Classification Search
CPC ............. G03F 7/70033; G03F 7/70058; G03F 7/2037; G03F 7/2039; G03F 7/70; G03F 7/70008; G03F 7/70016; G03F 7/70041; G03F 7/708; G03F 7/70808; G03F 7/70841; G03F 7/70858; G03F 7/70883; G03F 7/70908–7095; G03F 7/70975; G03F 7/70991; H05G 2/00–008
USPC .......... 355/30, 52–55, 67–71, 77; 250/492.1, 250/492.2, 492.22, 493.1, 503.1, 504 r, 250/505.1, 515.1
See application file for complete search history.

(56) References Cited

U.S. PATENT DOCUMENTS

2004/0145292 A1\* 7/2004 Ahmad .................. H05G 2/003
                                                            313/231.31
2006/0261721 A1 11/2006 Niimi
(Continued)

FOREIGN PATENT DOCUMENTS

DE    102015203160    9/2015    .............. H05G 2/00
DE    102017212352    7/2018    .............. B08B 7/04
(Continued)

OTHER PUBLICATIONS

Office Action issued by the German Patent Office for Application No. 10 2020 206 876.3, dated Mar. 15, 2021 (with English Translation).
(Continued)

*Primary Examiner* — Christina A Riddle
(74) *Attorney, Agent, or Firm* — Fish & Richardson P.C.

(57) ABSTRACT

An inner insert for a passage opening in an outer insert for an EUV radiation source is embodied in multiple parts and/or has a plurality of sections that extend in the longitudinal direction and have different internal diameters ($d_i$, $d_a$).

13 Claims, 3 Drawing Sheets

(56) References Cited

U.S. PATENT DOCUMENTS

| | | | | |
|---|---|---|---|---|
| 2007/0210717 A1* | 9/2007 | Smith | ............... | H05G 2/003 |
| | | | | 315/111.51 |
| 2010/0200777 A1 | 8/2010 | Hauf | | |
| 2010/0215136 A1* | 8/2010 | Rusnak | ............... | H05H 1/06 |
| | | | | 376/108 |
| 2011/0089834 A1 | 4/2011 | McGeoch | | |
| 2013/0313423 A1* | 11/2013 | Umstadter | ............. | H05G 2/008 |
| | | | | 250/282 |

FOREIGN PATENT DOCUMENTS

| | | | | |
|---|---|---|---|---|
| EP | 1 774 838 | 4/2011 | ............... | H05G 2/00 |
| JP | S63-026931 | 2/1988 | ............... | H01J 35/22 |
| JP | 2006-324173 | 11/2006 | ............... | H05G 2/00 |
| JP | 2012-235043 | 11/2012 | ........... | H01L 21/027 |
| JP | 2014-179624 | 9/2014 | ........... | H01L 21/027 |
| RU | 2593147 C1 * | 7/2016 | | |
| WO | WO 2009/100856 | 8/2009 | ............... | G02B 5/09 |

OTHER PUBLICATIONS

Blackborow, P., et al., "EUV Source development for AIMS and Blank Inspection", *Proc. SPIE 7636*, Extreme Ultraviolet (EUV) Lithography, 763609 (Mar. 17, 2010).

Notification of Reasons for Refusal issued by the Japanese Patent Office for Application No. JP 2021-093499, dated May 30, 2022 (with English Translation).

* cited by examiner

EUV RADIATION SOURCE, INSERT FOR AN EUV RADIATION SOURCE AND INSERT FOR AN INSERT FOR AN EUV RADIATION SOURCE

CROSS-REFERENCE TO RELATED APPLICATIONS

This application claims priority under 35 U.S.C. § 119 from German Application DE 10 2020 206 876.3, filed on Jun. 3, 2021, the entire content of which is incorporated herein by reference.

TECHNICAL FIELD

The invention relates to an EUV radiation source, to an insert for such an EUV radiation source, and to an insert for an insert for such an EUV radiation source. In addition, the invention relates to an illumination system, to a projection exposure apparatus, and to a metrology system having such an EUV radiation source.

BACKGROUND

Used radiation in the EUV range can be generated in an EUV radiation source by igniting a source plasma in a source chamber of the EUV radiation source. US 2011/0089834 A1 describes an embodiment of an EUV radiation source with an electrode plasma generation device. EP 1 774 838 B1 discloses an inductively coupled plasma source.

An EUV radiation source is also known for example from Blackborow et al. (2010), "EUV source development for AIMS and blank inspection;" Proc SPIE, 7636.

EUV radiation sources are used in illumination systems for projection exposure apparatuses, in particular for EUV lithography inspection apparatuses and metrology systems. A corresponding projection exposure apparatus is known for example from WO 2009/100 856 A1.

In some examples, during the operation of the projection exposure apparatus, it is essential that the EUV radiation source generates radiation pulses of substantially consistent, constant intensity. It has been shown that this is not directly the case after wear parts of the radiation source are exchanged. EUV radiation sources therefore typically need to undergo a lengthy and complex conditioning process after an exchange of wear parts.

SUMMARY

A general aspect of the present invention is to improve an EUV radiation source. It is in particular an aspect of the present invention to improve an EUV radiation source such that the conditioning process is simplified, in particular shortened, after an exchange of wear parts of the EUV radiation source.

This aspect is achieved by a radiation source having a first insert that is insertable into a chamber opening, the first insert having a channel extending in a longitudinal direction and an inner insert arranged in the passage channel. The core of the invention consists in embodying the inner insert in multiple parts and/or such that it has a plurality of, in particular two, three or more, sections that extend in the longitudinal direction and have different internal diameters.

The first insert, which is insertable into the chamber opening, and the inner insert, which is arranged in the passage channel, form independent subjects of the present invention.

The first insert is also referred to as the outer insert or as a "carrier". Sometimes, the first insert with the passage channel and the inner insert as a whole is also referred to as a bore.

The inner insert is sometimes also referred to as a "sleeve". It may in particular be formed in the manner of a sleeve. In particular, it may have sleeve-type sections.

The inner insert in particular has hollow cylindrical sections. This is intended to mean that the inner passage channel, which is defined by the inner insert and is delimited in particular in the direction perpendicular to the longitudinal direction, is at least in part cylindrical, in particular circular-cylindrical. It can have in particular a circular cross section.

The outer circumference of the inner insert can in principle be substantially arbitrary. The inner insert can in particular also have a circular outer circumference.

The carrier and/or the inner insert can preferably be exchangeable. In particular, they are exchangeable wear parts.

The outer passage channel can in particular be substantially cylindrical, in particular circular-cylindrical. In particular, it may be designed such that it expands in the direction of one or both ends.

The first, outer insert is in particular in electrical contact with an element of the source chamber, in particular with a plate thereof to which electrical voltage is able to be applied.

The carrier is in particular in thermal contact with the source chamber, in particular with a plate thereof to which voltage is able to be applied.

The carrier is in particular in electrical contact with an element of the source chamber, in particular with a base plate thereof.

The carrier is in particular in thermal contact with the source chamber, in particular with a base plate thereof.

Among other things, the carrier serves as a high-performance electrical conductor.

Among other things, the carrier serves as a high-performance thermal conductor. The carrier in particular contributes to the vacuum stability and to the structural stability of the source chamber. It additionally serves in particular for positioning the source plasma.

The position of the source plasma is further delimited with the aid of the second, inner insert. The inner insert then serves in particular as "confinement" (spatial delimitation).

The inner insert serves moreover in particular as protection for the outer insert, in particular against the source plasma. The source plasma can lead to sputtering of the first insert and/or of the second insert. This can lead to soiling of the radiation source.

According to an aspect of the invention, the inner insert lies flat against the inside of the outer passage channel.

This makes a mechanically stable, in particular precise arrangement of the inner insert in the outer insert possible.

The inner insert lies in particular substantially over its entire circumference, in particular over its entire outer surface, against the inside of the outer passage channel in the direction perpendicular to the longitudinal direction.

The inner insert can in particular be arranged in the passage channel substantially without play. The inner insert can in particular be thermally shrunk into the first passage channel. It may also be soldered, welded or adhesively bonded in the passage channel. In particular, it is arranged with a form fit and/or by a material bond.

It can be arranged in the passage channel so as to be rotatable about the longitudinal axis. It can also be secured against rotations about the longitudinal axis by way of symmetry-breaking means.

According to a further aspect of the invention, the inner insert has an end position, defined in the longitudinal direction, in the outer insert. To this end, it can have one or more abutment elements, for example in the form of a collar, a shoulder, a thickening, in particular an end-side thickening. It can also have a slightly conical outer side.

According to a further aspect of the invention, the inner insert is arranged in the outer passage channel such that it completely covers an inner wall, which extends parallel to the longitudinal direction from a first end region to a second end region, of the outer passage channel in the region of the first end region in the direction perpendicular to the longitudinal direction.

It has been found that the first insert, in particular the outer passage channel, is hereby particularly effectively protected against wear due to the source plasma. In addition, the pulse-to-pulse stability was improved hereby.

Alternatively, a shorter design of the inner insert is possible. In this way, thermal stresses in the inner insert can be reduced.

According to a particularly advantageous alternative, the inner insert extends all the way to the end region of the outer passage channel, wherein the inner insert has two, three or more parts that adjoin one another in the longitudinal direction.

It has been found according to the invention that advantages, in particular with respect to the pulse-to-pulse stability of the radiation source, may arise after an exchange of the inner insert if the latter is embodied in multiple parts, in particular two, three or more parts, and/or if the inner passage channel has a plurality of sections extending in the longitudinal direction that have different internal diameters.

According to an aspect of the invention, the inner insert has in particular a plurality of constituent parts that adjoin one another in the longitudinal direction, wherein at least two of the constituent parts have sections extending in the longitudinal direction that have different internal diameters, which are constant in the longitudinal direction.

These may in particular be hollow cylindrical constituent parts. In the transition region between the constituent parts having different internal diameters, the inner passage channel preferably has bevels. The inner passage channel can have in particular an internal diameter that is describable as a function of a position in the longitudinal direction by a continuous function. The inner passage channel can be formed in particular without steps.

The diameter of the inner passage channel can in particular be described as a function of the position in the longitudinal direction by a monotonic, but in particular not strictly monotonic, function.

The inner insert has in particular internal diameters which are constant in regions but differ in sections.

According to a further aspect of the invention, the inner insert has a substantially constant external diameter. On account of this, introduction of the insert into the outer insert and secure fit of the inner insert in the outer passage channel is simplified and/or improved.

The inner insert can also have an outer shape having a slightly conical form. In this way, a predetermined slide-in depth, in particular an end position of the inner insert in the outer insert, can be defined.

The inner insert can also have one or more abutment elements, for example in the form of a collar, a shoulder or a thickening, in particular an end-side thickening. This also ensures a predetermined end position.

The inner insert is preferably made from one or more plasma-resistant materials.

The inner insert is in particular made from one or more heat-resistant materials. The materials of the inner insert have in particular one or more materials having a melting point of at least 1000° C., in particular at least 1500° C., in particular at least 2000° C. In the case of silicon carbide, which is not made to melt in a vacuum, but which decomposes, the melting point is here understood to mean the temperature at which a corresponding decomposition occurs.

The inner insert is preferably made from one or more materials having a thermal conductivity of at least 100 W/(m·K), in particular of at least 130 W/(m·K).

According to a further aspect of the invention, the inner insert is produced at least partially from molybdenum or a molybdenum compound.

It has been found that molybdenum or molybdenum compounds are highly suitable for producing a corresponding insert. An inner insert made from molybdenum in particular brought about a high stability from the beginning. An inner insert made from molybdenum additionally brought about a brightness that was initially high.

The insert can be produced in particular in sections from molybdenum or a molybdenum compound. In particular, it can have one or more sections that consist of molybdenum or a molybdenum compound, that is to say are entirely made from molybdenum or a molybdenum compound.

The inner insert can also have one or more constituent parts made from silicon carbide.

According to a further aspect of the invention, the outer insert can also be produced at least partially, in particular completely, from molybdenum or a molybdenum compound. It may in particular be formed monolithically.

According to a further aspect of the invention, it has been found that it may be advantageous to monolithically form the carrier and the inner insert in one piece. Such a monolithic insert can in particular be produced or consist of molybdenum or a molybdenum compound.

Further objects of the invention consist in improving an illumination system for a projection exposure apparatus, a mask inspection apparatus or a metrology system.

This object is achieved by an illumination system having a radiation source with an insert in accordance with the preceding description. The advantages are evident from those of the insert.

Further objects of the invention consist in improving a lithographic projection exposure apparatus and a mask inspection apparatus or a metrology system.

These objects are achieved by corresponding apparatuses having a radiation source with an insert in accordance with the preceding description. The advantages are evident from those of the insert.

BRIEF DESCRIPTION OF DRAWINGS

Further advantages and details of the invention will become apparent from the description of exemplary embodiments with reference to the figures. In the figures.

DETAILED DESCRIPTION

Figure 1:
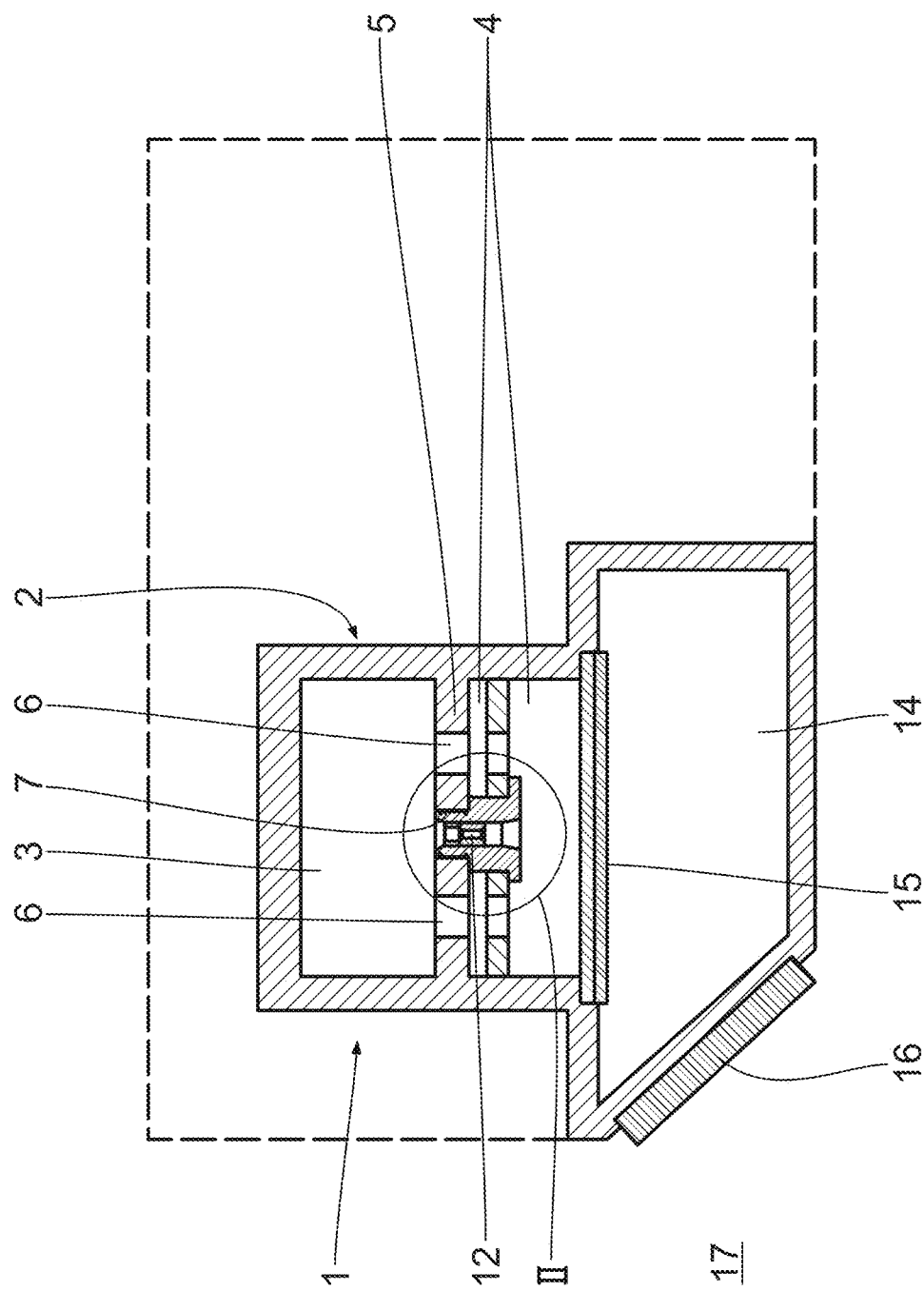
FIG. 1 shows a schematic sectional drawing of an EUV radiation source.

FIG. 1 illustrates a schematic sectional drawing of an exemplary embodiment of an EUV radiation source 1. The EUV radiation source 1 is part of an illumination system (not illustrated explicitly) of a projection exposure apparatus. For fundamental details, reference is made by way of example to DE 10 2017 212 352 A1, which is hereby fully incorporated in the present application as part thereof.

The EUV radiation source 1 has a two-part source chamber 2 having an upper chamber part 3 and a lower chamber part 4. A center plate 5 is located between the upper chamber part 3 and the lower chamber part 4. The center plate 5 forms a chamber wall of the source chamber 2, in particular of the upper chamber part 3.

The center plate 5 has eccentric openings 6 and a central opening 7.

The center plate 5 can be embodied in multiple parts. It can have in particular a plate 18, which faces the source chamber 2 and to which a high voltage is able to be applied, and, separately therefrom, an outer base plate 19.

A first insert 8 is inserted into the central opening 7. The first insert 8 forms an outer insert. The first insert 8 is also referred to as "carrier". It has a first passage channel 10 extending in a longitudinal direction 9.

A second insert 11 is arranged in the first passage channel 10. The second insert 11 has a second passage channel 12 extending in the longitudinal direction 9. The carrier with the inner insert 11 is sometimes also referred to as "bore".

The first passage channel 10 is also referred to as the outer passage channel. The second passage channel 12 is also referred to as the inner passage channel. The two passage channels 10, 12 have a common longitudinal axis 13 extending in the longitudinal direction 9.

During operation of the EUV radiation source 1, the eccentric openings 6 and the central opening 7, in particular the passage channels 10, 12, serve for the passage of a source plasma ignited in the chamber parts 3, 4.

The EUV radiation source 1 is an induction plasma current generator. Constituent parts of an illumination optical unit (not illustrated explicitly) of a projection exposure apparatus, of a mask inspection apparatus or of a metrology system are connected to the EUV radiation source 1. The illumination optical unit is in particular a constituent part of an illumination system. The illumination system can comprise in particular one or more mirrors, in particular one or more facet mirrors. The illumination optical unit in particular serves for transferring illumination radiation, which has been generated by the EUV radiation source 1, to a mask having structures to be imaged. The mask is also referred to as reticle.

FIG. 1 likewise schematically illustrates a maintenance region 14 adjacent to the EUV radiation source 1. An interface having a dome stop 15 is provided between the maintenance region 14 and the EUV radiation source 1. For details, reference is made to DE 10 2017 212 352 A1, in particular to FIG. 23 and the associated description.

The maintenance region 14 is sealable so as to be vacuum-tight with respect to an outer region 17 with the aid of a maintenance flap 16. The maintenance flap 16 can be opened for maintenance purposes. In the opened state of the maintenance flap 16, the maintenance region 14, and consequently the EUV radiation source 1, can be accessed. It is in particular possible for the two inserts 8, 11 to be removed from the EUV radiation source 1 through the maintenance region 14, for example in order to exchange them. Details of the first insert 8 and in particular of the second insert 11 are described below with reference to FIG. 2. Corresponding embodiments of the inserts 8, 11 are advantageous independently of the remaining construction details of the EUV radiation source 1.

The outer, first insert 8 is connected, for example via a plurality of screws, to the plate 18. It has in particular an electrical contact 21 to the plate 18. An O-ring is provided in the connection region between the first insert 8 and the plate 18.

The first insert 8 is connected, for example via a plurality of screws, to the base plate 19. It has in particular an electrical contact 23 to the base plate 19. An O-ring is provided in the contact region between the first insert 8 and the base plate 19.

The inner, second insert 11 lies circumferentially against the inner circumference of the first passage channel 10. It is arranged in particular substantially without play in the first passage channel 10. However, it can be arranged in the first passage channel 10 so as to be displaceable in the longitudinal direction.

The inner insert 11 can be thermally shrunk in the passage channel 10. The inner insert 11 can also be soldered, welded or adhesively bonded to the passage channel 10. It can also be connected to the passage channel 10 with a form fit and/or by a material bond.

Figure 2:
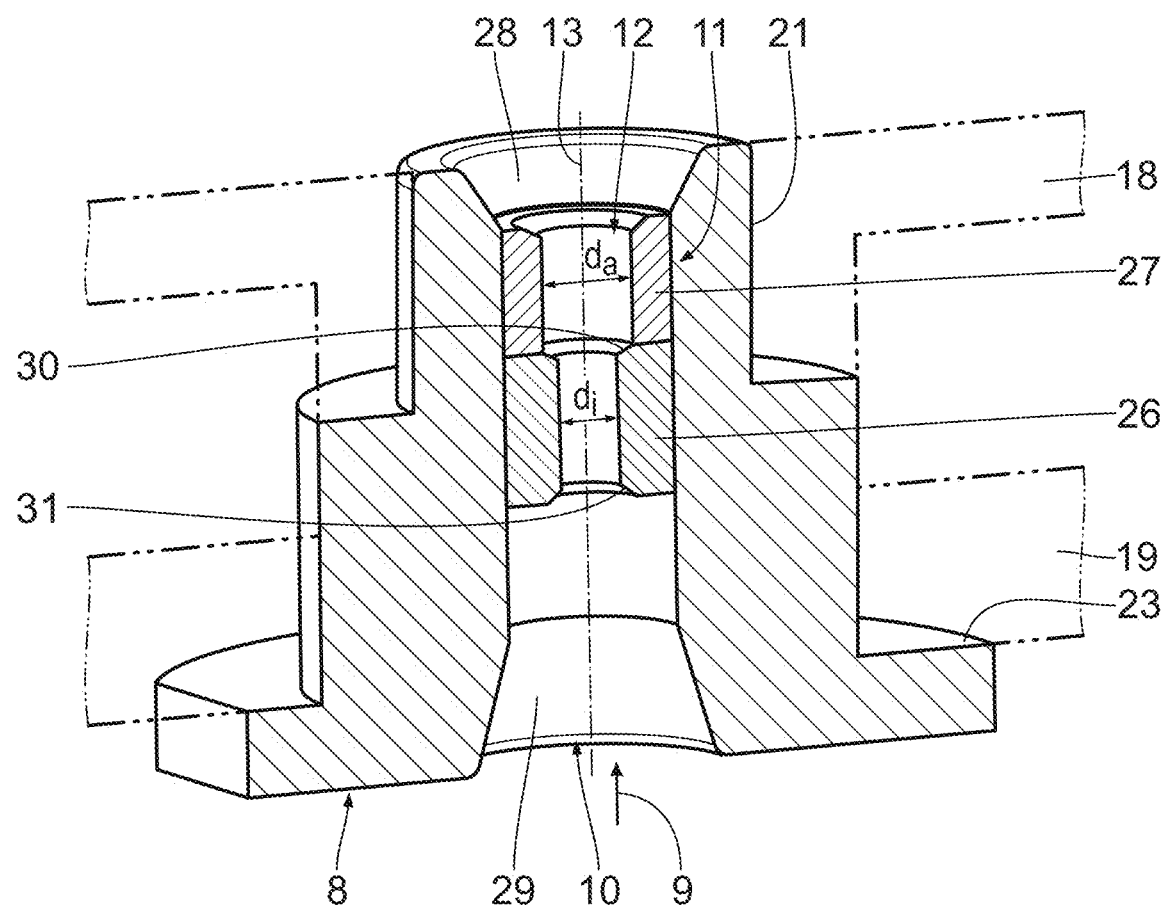
FIG. 2 shows a partially schematic sectional illustration through a detail from a source chamber of the EUV radiation source in the region of a passage channel.

In the variant illustrated in FIG. 2, the inner insert 11 is formed in two parts. It has in particular an inner part 26 and an outer part 27 adjoining the former in the longitudinal direction 9. The inner part 26 and the outer part 27 are formed by separate parts.

The two parts 26, 27 are disposed next to one another.

The inner part 26 and the outer part 27 have substantially constant external diameters over their extents in the longitudinal direction 9. They have in particular identical external diameters.

The inner part 26 and the outer part 27 can be made from the same material. They can be made in particular from silicon carbide. It is also possible for one or both of these parts 26, 27 to be produced from molybdenum or a molybdenum compound. The inner part 26 and/or the outer part 27 can in particular consist of molybdenum or a molybdenum compound.

The outer part 27 has a larger internal diameter than the inner part 26. The ratio of the internal diameter $d_a$ of the outer part 27 to the internal diameter $d_i$ of the inner part 26 lies in the range from 1.1 to 5, in particular in the range from 1.5 to 3.

The outer part 27 extends in the longitudinal direction up to an inner end region 28 of the first passage channel 10. The first passage channel 10 is not covered in the region of its opposite, second end region by the insert 11.

The outer part 27 is embodied in the manner of a sleeve. In particular, it is of a hollow cylindrical design. In particular, it can have a cross section with a circular outer circumference and a circular inner circumference.

The inner part 26 is embodied in the manner of a sleeve. In particular, it is of a hollow cylindrical design. However, it has end-side bevels 30, 31.

A variant of the inner, second insert 11 will be described below with reference to FIG. 3. Identical components have the same reference signs as in the variant according to FIG. 2.

In this variant, the first passage channel 10 extends up to the inner end of the first insert 8 in the longitudinal direction 9. As opposed to the variant according to FIG. 2, it has no bevel. Accordingly, the outer part 27 of the insert 11 extends up to the end of the first insert 8 in the longitudinal direction 9.

Figure 3:
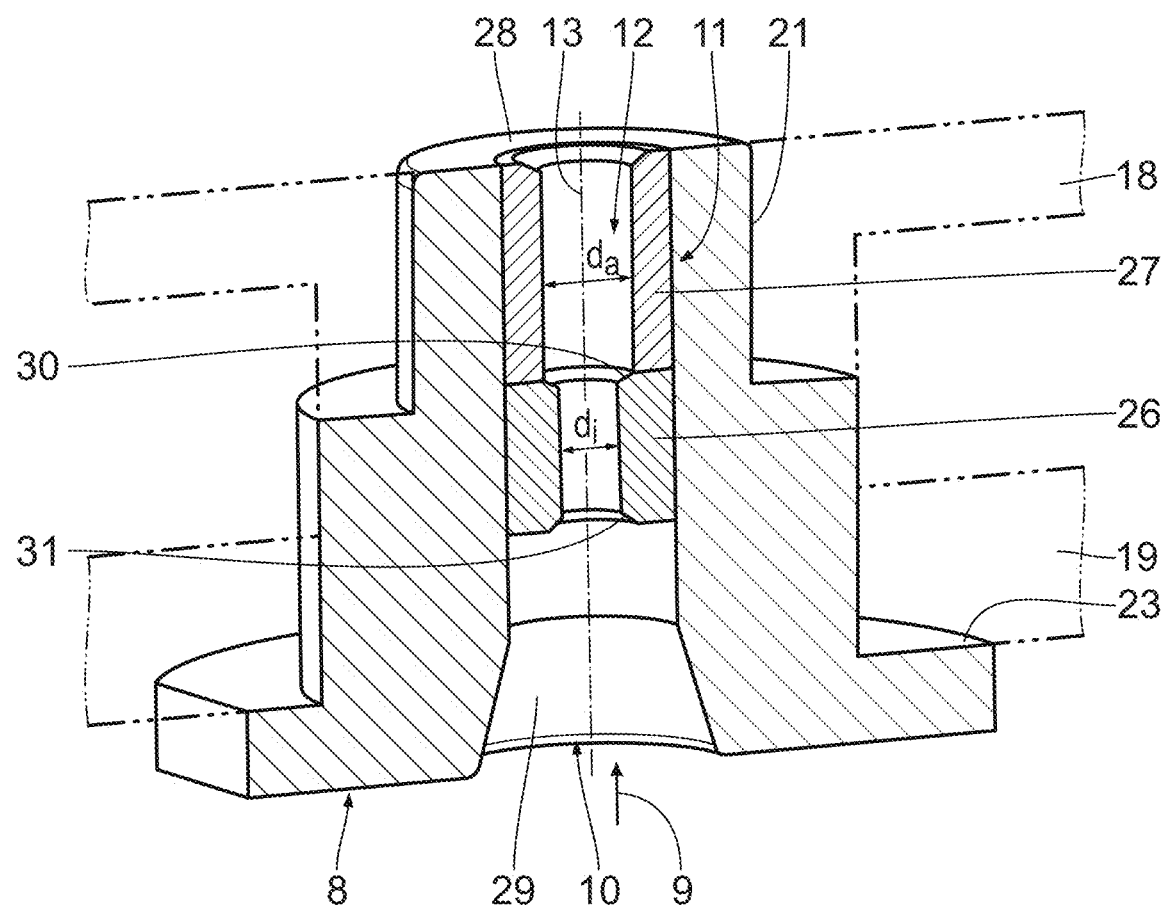
FIG. 3 shows an illustration according to FIG. 2 with a variant of the inner insert in the passage channel.

The outer part 27 in the variant according to FIG. 3 has approximately the same extent in the longitudinal direction 9 as the inner part 26.

Generally, the two parts 26, 27 can have substantially identical extents in the longitudinal direction 9. It is also possible for the two parts 26, 27 to be formed with different extents in the longitudinal direction 9. The difference can be in particular more than 10%, in particular more than 20%, in particular more than 50%. It can be in particular less than 300%, in particular less than 200%, in particular less than 100%.

The overall extent of the two parts 26, 27 in the longitudinal direction 9 lies in particular in the range from 2 cm to 15 cm, in particular in the range from 3 cm to 10 cm, in particular in the range from 4 cm to 8 cm.

According to a variant, the two parts 26, 27 are not formed as separate parts but in one part. The inner, second insert 11 has two sections that extend in the longitudinal direction 9 and have different internal diameters $d_a$, $d_i$ in this variant as well.

A one-part design of the insert 11 makes the production of the insert 11 easier. It also simplifies the precise arrangement of the insert 11 in the passage channel 10.

The insert 11 according to the variant illustrated in FIG. 2 being designed in two or more parts results in a reduction in the thermal stresses in the individual constituent parts of the insert 11. Hereby, the risk of the insert 11 breaking during the operation of the EUV radiation source 1 can be reduced.

FIGS. 2 and 3 illustrate two-part variants of the insert 11. This should not be understood to be limiting. The insert 11 can also be embodied in one, three, four or more parts. Generally, it can have one, two, three, four or more constituent parts that are adjacent to one another in the longitudinal direction 9.

Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments.

Even though the invention has been described on the basis of specific embodiments, numerous variations and alternative embodiments will be apparent to the person skilled in the art, for example through combination and/or exchange of features of individual embodiments. Accordingly, it goes without saying for the person skilled in the art that such variations and alternative embodiments are also encompassed by the present invention, and the scope of the invention is restricted only within the meaning of the appended patent claims and the equivalents thereof.

What is claimed is:

1. An EUV radiation source, comprising
a source chamber with
a chamber wall having at least one chamber opening,
a first insert, inserted into the chamber opening, with an outer passage channel extending in a longitudinal direction, and
an inner insert, arranged in the outer passage channel, with an inner passage channel extending in the longitudinal direction,
wherein the inner insert
is embodied in two or more separate parts that adjoin one another in the longitudinal direction and
has a plurality of sections that extend in the longitudinal direction and have different internal diameters (di, da), which are constant in the longitudinal direction.

2. The EUV radiation source of claim 1, wherein the inner insert is arranged in the outer passage channel such that it completely covers an inner wall, which extends parallel to the longitudinal direction from a first end region to a second end region, of the outer passage channel in the region of the first end region in the direction perpendicular to the longitudinal direction.

3. An insert configured to be disposed in a source chamber of an EUV radiation source, in which the source chamber comprises a chamber wall having at least one chamber opening, the insert comprising
an outer passage channel extending in a longitudinal direction, and
an inner insert, arranged in the outer passage channel, with an inner passage channel extending in the longitudinal direction,
wherein the inner insert
is embodied in two or more separate parts that adjoin one another in the longitudinal direction and
has a plurality of sections that extend in the longitudinal direction and have different internal diameters (di, da), which are constant in the longitudinal direction.

4. The insert of claim 3, wherein the inner insert lies flat against the inside of the outer passage channel.

5. The insert of claim 3, wherein the inner insert is arranged in the outer passage channel such that it completely covers an inner wall, which extends parallel to the longitudinal direction from a first end region to a second end region, of the outer passage channel in the region of the first end region in the direction perpendicular to the longitudinal direction.

6. An illumination system for a projection exposure apparatus, a mask inspection apparatus or a metrology system, having an EUV radiation source with an insert according to claim 3.

7. A projection exposure apparatus for EUV lithography, comprising
the illumination system according to claim 6 for illuminating a reticle arranged in an object field, and
a projection optical unit for imaging the reticle onto a wafer arranged in an image field.

8. The projection exposure apparatus of claim 7, wherein the inner insert lies flat against the inside of the outer passage channel.

9. The projection exposure apparatus of claim 7, wherein the inner insert is arranged in the outer passage channel such that it completely covers an inner wall, which extends parallel to the longitudinal direction from a first end region to a second end region, of the outer passage channel in the region of the first end region in the direction perpendicular to the longitudinal direction.

10. A metrology system for inspecting a mask for EUV lithography, having the illumination system according to claim 6.

11. The illumination system of claim 6, wherein the inner insert lies flat against the inside of the outer passage channel.

12. The illumination system of claim 6, wherein the inner insert is arranged in the outer passage channel such that it completely covers an inner wall, which extends parallel to the longitudinal direction from a first end region to a second end region, of the outer passage channel in the region of the first end region in the direction perpendicular to the longitudinal direction.

13. The illumination system of claim 6, wherein the inner insert is produced at least partially from molybdenum or a molybdenum compound.

* * * * *

UNITED STATES PATENT AND TRADEMARK OFFICE
CERTIFICATE OF CORRECTION

| | |
|---|---|
| PATENT NO. | : 11,550,225 B2 |
| APPLICATION NO. | : 17/336480 |
| DATED | : January 10, 2023 |
| INVENTOR(S) | : Iris Pilch et al. |

It is certified that error appears in the above-identified patent and that said Letters Patent is hereby corrected as shown below:

In the Specification

<u>Column 1</u>
Line 11 (Approx.), delete "2021", and insert -- 2020 --.

Signed and Sealed this
Fourteenth Day of March, 2023

Katherine Kelly Vidal
*Director of the United States Patent and Trademark Office*